United States Patent [19]
Gotoh et al.

[11] Patent Number: 5,623,439
[45] Date of Patent: Apr. 22, 1997

[54] FERROELECTRIC MEMORY DEVICE

[75] Inventors: Kohtaroh Gotoh; Hirotaka Tamura; Akira Yoshida, all of Kawasaki, Japan

[73] Assignee: Fujitsu Limited, Kawasaki, Japan

[21] Appl. No.: 439,780

[22] Filed: May 12, 1995

[30] Foreign Application Priority Data

Jun. 1, 1994 [JP] Japan .................................. 6-119770

[51] Int. Cl.⁶ .................................................. H01L 29/78
[52] U.S. Cl. ........................... 365/145; 257/295; 257/39; 257/77; 257/78
[58] Field of Search ........................... 365/145, 149; 257/295, 78, 77, 613, 39

[56] References Cited

U.S. PATENT DOCUMENTS 5,418,389   5/1995   Watanabe ..................... 257/295
5,498,888   3/1996   Ozawa ......................... 257/295

OTHER PUBLICATIONS

Nikkei Microdevices, Nov. 1994, p. 53 Ferroelectric Memory ● Cell Technology (and translation).

*Primary Examiner*—David C. Nelms
*Assistant Examiner*—Vu A. Le
*Attorney, Agent, or Firm*—Armstrng, Westerman, Hattori, McLeland & Naughton

[57] ABSTRACT

A ferroelectric memory device includes a channel layer of a dielectric material containing oxygen, source and drain electrode provided on the channel layer across a channel region defined in the channel layer, a ferroelectric memory layer provided on the channel layer so as to cover at least the channel region, and a write control electrode provided on the ferroelectric memory layer for applying an electric field thereto.

16 Claims, 4 Drawing Sheets

FERROELECTRIC MEMORY DEVICE

BACKGROUND OF THE INVENTION

The present invention generally relates to memory devices and more particularly to a ferroelectric memory device that stores information in the form of polarization of a dielectric film.

Semiconductor memories are used extensively in human society, together with central processing units (CPUs), to form various electronic apparatuses and systems that range from main frame computers to home electronic products. In DRAMs in particular, there is a persisting trend to increase the memory capacity, and this trend is now accelerating. Today, DRAMs having a memory capacity of 256 Mbits or 1 Gbits are the target of intensive research.

On the other hand, conventional DRAMs have a complex structure, and because of this, it is expected that such an increase of the memory capacity reaches a limit in one or two generations. In DRAMs, information is stored in a minute memory cell capacitor in the form of electric charges, while miniaturization of the memory device inevitably invites a decrease of the capacitance and hence the electric charges stored in the memory cell capacitor. Although there are attempts to defer the decrease of capacitance of memory cell capacitors as much as possible by devising a complex capacitor structure, such an approach is reaching a limit. In order to realize a DRAM having a memory capacity of 256 Mbits or more, it is necessary to construct the semiconductor memory device based upon a new principle.

On the other hand, there are non-volatile semiconductor memories such as EPROM or flash memory that are capable of retaining information even when the electric power is turned off. As such non-volatile semiconductor memories are compact and solid and consume little electric power, they are expected to replace conventional magnetic memories such as hard disk drives or floppy disks. On the other hand, such conventional non-volatile semiconductor memories store information in a floating gate electrode in the form of electric charges, and thus, such conventional non-volatile semiconductor memory devices have a drawback in that they require precise control of electric charge injection and removal in order to avoid the problem of excessive erasing of information. Further, the number of times the data is rewritten by way of charge injection is limited to $10^5$–$10^6$ times.

Meanwhile, it is known that ferroelectric materials have a large capacitance that is several ten to several hundred times as large as the capacitance of the dielectric material such as $SiO_2$ or $SiN$ that are used conventionally in DRAMs. Further, such ferroelectric materials show a spontaneous polarization, and thus they can be used for storing information in the form of polarization. As spontaneous polarization of the ferroelectric materials does not disappear even when the electric field is removed, it is possible to construct a non-volatile semiconductor memory device by using a ferroelectric material.

As the semiconductor memory device that uses a ferroelectric film, a device structure called MFS (metal ferroelectric semiconductor) transistor is proposed, wherein the MFS transistor is a transistor having a structure identical to that of a MOS FET, except that the gate oxide film thereof is replaced by a ferroelectric film. In this transistor, information is stored in the foregoing ferroelectric film in the form of polarization. For example, a structure is proposed in which a single crystal TGS (triglycine sulfate) is used for the ferroelectric gate. Further, there is a report that a successful operation is obtained in a device in which the gate oxide film is replaced by a ferroelectric film in a Si MOS transistor.

In the known structure of the ferroelectric semiconductor memory device in which the gate oxide film is simply replaced by a ferroelectric film, it is necessary to deposit the ferroelectric film directly upon a semiconductor layer such as Si or GaAs. When a ferroelectric film, typically an oxide such as PZT or $BaTiO_3$, is deposited directly on a semiconductor layer of non-oxide, there occurs a problem of diffusion of oxygen atoms from the dielectric film into the semiconductor layer. Thereby, there is a substantial risk that the electric charges are trapped at the semiconductor-ferroelectric interface by defects that are created by the diffused oxygen atoms. When such a trapping of the electric charges occurs, the operation of the memory device is inevitably deteriorated and becomes unstable. Further, the deposition of high quality dielectric films requires a deposition temperature higher than 500° C., while such a high temperature treatment tends to invite interdiffusion of other elements between the dielectric film and the semiconductor layer.

In order to realize a reliable ferroelectric semiconductor memory device, it has been necessary to carefully select the ferroelectric material such that no substantial deterioration occurs in the semiconductor layer and also in the ferroelectric film.

Further, such conventional ferroelectric semiconductor memories have another serious drawback in that the voltage applied to the gate electrode for causing a polarization in the ferroelectric film, is more or less applied directly to the semiconductor substrate underneath the ferroelectric film, more specifically the surface part of the substrate where oxygen contaminants are contained, without inducing any substantial electric field in the ferroelectric film. It should be noted that the ferroelectric film has a large dielectric constant while the semiconductor layer has a much smaller dielectric constant. In other words, there occurs no substantial voltage drop across the ferroelectric film even when a write control voltage is applied to the gate electrode. Thus, the conventional ferroelectric semiconductor memory device has suffered from a problem that it requires a large write control voltage.

SUMMARY OF THE INVENTION

Accordingly, it is a general object of the present invention to provide a ferroelectric memory device wherein the foregoing problems are eliminated.

Another and more specific object of the present invention is to provide a ferroelectric memory device that is free from the problem of deterioration of materials that form the memory device when fabricating the device.

Another object of the present invention is to provide a ferroelectric memory device that is reliable and can be produced with reproducibility.

Another object of the present invention is to provide a ferroelectric memory device, comprising:

a channel layer of a dielectric material containing oxygen for causing carriers to flow therethrough;

a source electrode provided on said channel layer for injecting carriers into said channel layer;

a drain electrode provided on said channel layer with a separation from said source electrode for collecting carriers from said channel layer;

said source electrode and said drain electrode thereby defining a channel region extending therebetween as a passage of carriers, said channel region passing carriers therethrough;

a ferroelectric memory layer provided adjacent to said channel layer so as to cover at least said channel region; and a write control electrode provided on said ferroelectric memory layer for applying an electric field to said ferroelectric memory layer.

According to the present invention, the problem of diffusion of oxygen atoms from the ferroelectric gate insulation into the channel layer is positively prevented by using an oxide for the channel layer. For example, one may use an oxide having the perovskite or spinel structure such as $SrTiO_3$ or $MgAl_2O_4$ for the oxide channel layer. By using the dielectric material of the perovskite or spinel structure having a large dielectric constant for the channel layer, it becomes possible to apply a large electric field sufficient to cause a polarization in the ferroelectric film. Further, one can dope the channel layer with various levels ranging from an insulator to a conductor. Further, the channel layer of perovskite or spinel structure provides an excellent matching with respect to the ferroelectric material, and the problem of formation of defects in the channel layer due to the oxide diffusion from the ferroelectric gate insulation is successfully eliminated.

In operation, writing of information is achieved by inducing a polarization in the ferroelectric gate insulation. Such a polarization is achieved by applying an electric field to the ferroelectric, while such an electric field is merely induced by applying, for example, a voltage across a gate electrode provided on the ferroelectric and the channel layer. Once induced, the polarization is retained even after the electric field is removed due to the well known hysteresis of ferroelectrics.

When reading information, the source-drain voltage or current is detected for the selected memory cell. It should be noted that the polarization of the ferroelectric film influences the electric charges in the channel region that are formed in the vicinity of the surface of the channel layer, and thus, the source-drain conductance changes depending upon the state of polarization of the ferroelectric film. In other words, it is possible to detect the content of the binary information held in the memory cell transistor by detecting the drain voltage or current.

Other objects and further features of the present invention will become apparent from the following detailed description of the preferred embodiments when read in conjunction with the attached drawings.

DESCRIPTION OF THE PREFERRED EMBODIMENTS

Figure 1:
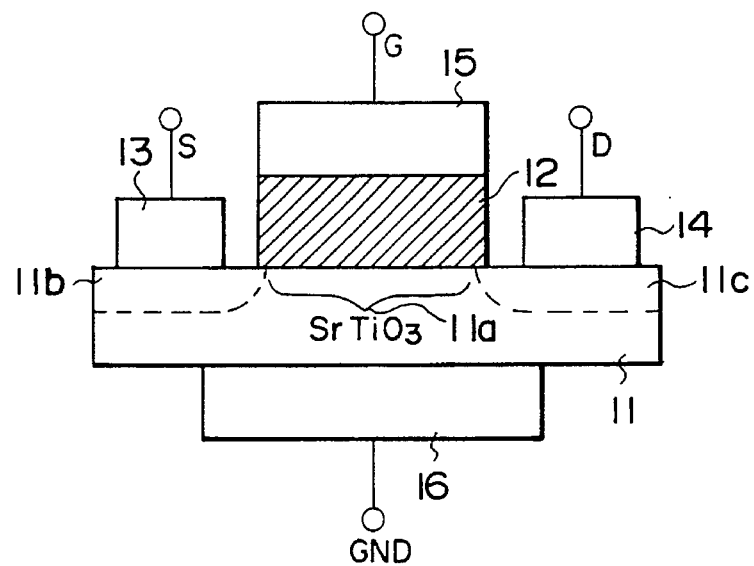
FIG. 1 is a diagram showing the construction of a ferroelectric memory device according to a first embodiment of the present invention.

FIG. 1 shows the construction of a ferroelectric memory according to a first embodiment of the present invention.

Referring to FIG. 1, the semiconductor memory device includes a dielectric substrate 11 of $SrTiO_3$ doped to the n-type by 0.006 wt% Nb with a carrier concentration level of $10^{15}$ cm$^{-3}$, on which a ferroelectric gate insulation film 12 of $PbTiO_3$ or PZT (solid solution of $PbZrO_3$ and $PbTiO_3$) is deposited in correspondence to a channel region 11a. Further, source and drain regions 11b and 11c of the n$^+$-type are formed in the substrate 11 at both lateral sides of the channel region 11a by inducing oxygen reduction by Ar ion beam irradiation. Typically, the substrate 11 has a thickness of about 400 μm, while the ferroelectric gate insulation film 12 has a thickness of about 100 nm.

On the ferroelectric gate insulation film 12, there is provided a gate electrode 15 for applying a gate voltage thereto. Further, a source electrode 13 and a drain electrode 14 are provided on the substrate 11 respectively in correspondence to the source region 11b and the drain region 11c for injecting and removing carriers to and from the substrate 11. Furthermore, there is provided a ground electrode 16 on a rear surface of the substrate 11 for applying a voltage thereto. Typically, the electrodes 13 and 14 are formed by depositing a metal selected from a group of Nb, Y and W, wherein these metals form an ohmic contact or low resistance contact when deposited on an oxide. On the other hand, the gate electrode 15 or the ground electrode 16 is formed of Au or Pt that establishes a Schottky contact when deposited on an oxide. Thus, there is formed a depletion region between the substrate 11 and the ground electrode 16 as a result of the Schottky contact of the electrode 16.

Figure 2:
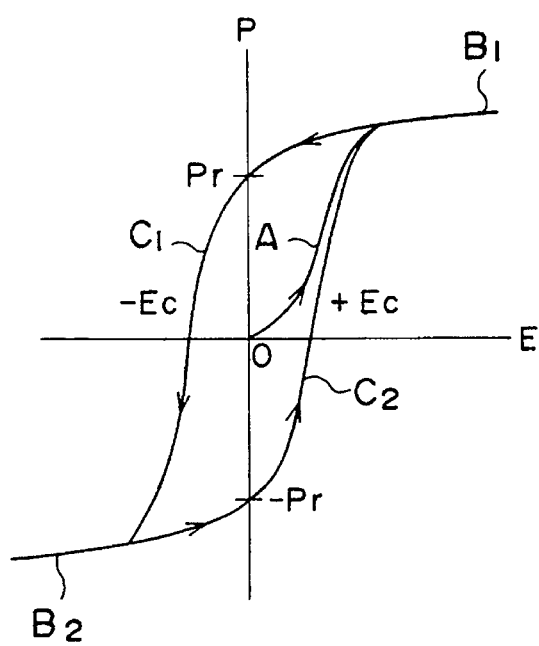
FIG. 2 is a diagram showing a hysteresis curve of a ferroelectric material used in the memory device of FIG. 1.

FIG. 2 shows the hysteresis of the ferroelectric gate insulation film 12.

Referring to FIG. 2 showing the relationship between the polarization P of the ferroelectric gate insulation film 12 and the external electric field E applied thereto, the polarization starts, assuming a state where there is no initial polarization, from an origin 0 and increases along a curve A with increasing strength of the external electric field E acting in a first, positive direction. After reaching a point $B_1$, the polarization P changes along a curve $C_1$ to a point $B_2$ with increasing strength of the external electric field E now acting in a second, negative direction. Further, the polarization P changes from the point $B_2$ to the foregoing point $B_1$ along a curve $C_2$ with the electric field E acting in the positive direction. Thereby, the ferroelectric gate insulation film 12 shows a polarization Pr, after being polarized by a large positive electric field E, even when the external electric field E is removed. Similarly, the gate insulation film 12 shows a polarization −Pr after being polarized by a large negative electric field −E even when the external electric field E is removed.

The relationship of FIG. 2 shows that the ferroelectric gate insulation film 12 of the device of FIG. 1 can store binary information in the form of spontaneous polarization. In the device of FIG. 1, such a writing of information is easily achieved by applying a positive or negative write control voltage across the gate electrode 15 and the ground electrode 16, with a magnitude sufficient to induce a polarization corresponding to the point $B_1$ or point $B_2$ in the ferroelectric gate insulation film 12.

Once the gate insulation film 12 is polarized to +Pt or −Pr, there is induced an electric field in the substrate 11 in correspondence to the channel region 11a similarly to the case where a gate voltage is applied to the gate electrode in conventional MOS FETs, and the flow of the carries between the source region 11b and the drain region 11c is controlled. When the gate insulation film 12 is polarized by a positive voltage applied to the gate electrode 15, the gate insulation film 12 induces negative electric charges along the lower major surface thereof, and such negative electric charges cause a turning-on of the MOS transistor similarly to the case of a positive gate voltage applied in an n-channel MOS transistor. When the gate insulation film 12 is polarized by a negative voltage applied to the gate electrode 15, on the other hand, the gate insulation film 12 induces positive electric charges along the lower major surface thereof, and such positive electric charges cause a turning-off of the MOS transistor similarly to the case of a negative gate voltage applied in an n-channel MOS transistor.

Thus, by detecting the source-drain voltage across the source electrode 13 and the drain electrode 14, it is possible to detect the direction of polarization of the dielectric gate insulation film and hence the content of the information. As the polarization of the ferroelectric gate insulation film 12 remains after the electric power is turned off, the device of FIG. 1 acts as a non-volatile semiconductor memory device.

In the present embodiment, the gate insulation film 12 of $PbTiO_3$ or PZT may be deposited on the substrate 11 of $SrTiO_3$ by an MOCVD process that uses $Pb(DPM)_2$ or $Pb(C_2H_5)_4$ for the source of Pb and $Ti(i-C_3H_7O)_4$ for the source of Ti. When depositing PZT, $Zr(DPM)_2$ is added further as the source of Zr. The deposition is conducted typically at a temperature higher than about 500° C. Even in such a case, there occurs no problem of oxygen interdiffusion between the gate insulation film 12 and the substrate 11, as the substrate 11 itself is formed of $SrTiO_3$, which is an oxide. Alternatively, one may deposit the gate insulation film 12 by a PVD process such as sputtering.

In the structure of FIG. 1, it should be noted that the substrate 11 has a large dielectric constant in the order of 200–300, which is comparable to the dielectric constant of the gate insulation film 12. Thus, the voltage applied across the electrodes 15 and 16 is divided more uniformly between the substrate 11 and the gate insulation film 12 as compared with the conventional structure that uses Si for the substrate. In other words, the voltage applied to the gate electrode 15 is used effectively for creating the electric field E in the ferroelectric gate insulation film 12 that eventually induces the polarization therein.

In the construction of FIG. 1, it should be noted also that the ferroelectric gate insulation film 12 may be any of the single crystal phase and the polycrystal phase. Further, the substrate 11 is not limited to $SrTiO_3$ but other suitable dielectric materials may also be used.

Figure 3:
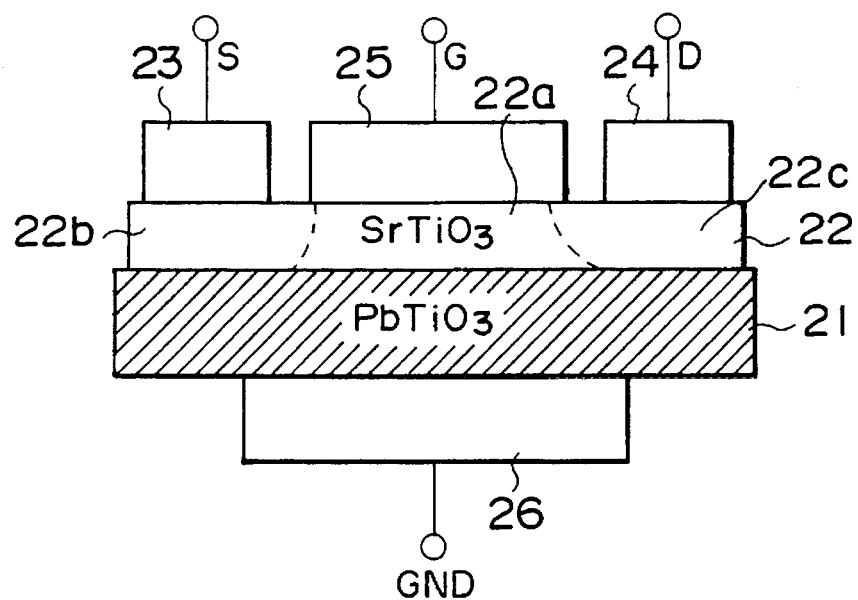
FIG. 3 is a diagram showing the construction of a ferroelectric memory device according to a second embodiment of the present invention.

FIG. 3 shows a second embodiment of the present invention.

Referring to FIG. 3, the semiconductor memory device is constructed upon a substrate 21 of $PbTiO_3$ on which a $SrTiO_3$ layer 22 is deposited as a channel layer. In the illustrated example, the substrate 21 is formed of a single crystal of $PbTiO_3$, and the $SiTiO_3$ layer 22 is deposited on the substrate 21 epitaxially by a CVD process that uses $Sr(DPM)_2$ and $Ti(i-C_3H_7O)_4$ as the source of Sr and Ti similarly as before, wherein the deposition of the $SrTiO_3$ layer 22 is conducted at a temperature exceeding 500° C.

On an upper major surface of the channel layer 22, a gate electrode 25 of Au or Pt is deposited in correspondence to a channel region, wherein the gate electrode 25 of Au or Pt establishes a Schottky contact against the channel layer 22. As a result, there is formed a depletion region along the boundary between the electrode 25 and the channel layer 22, and the electrode 25 is electrically insulated from the channel layer 22.

In the structure of FIG. 3, the channel layer 22 carries further a source electrode 23 and a drain electrode 24 of Nb, Y or W on the upper major surface thereof, wherein the channel layer 22 is doped to the $n^+$-type in correspondence to source and drain regions 22b and 22c, on which the electrodes 23 and 24 are provided. Thereby, a channel region 22a is defined in the channel layer 22 between the source and drain regions 22b and 22c. Further, there is provided another ohmic electrode 26 on a lower major surface of the substrate 21.

In this structure, too, the writing of information is achieved by inducing a polarization in the ferroelectric film 21 by applying a write control voltage across the gate electrode 25 and the electrode 26 at the rear side of the ferroelectric substrate 21. Further, the reading of information is achieved by detecting the conductance between the source region 22a and the drain region 22b.

Figure 4:
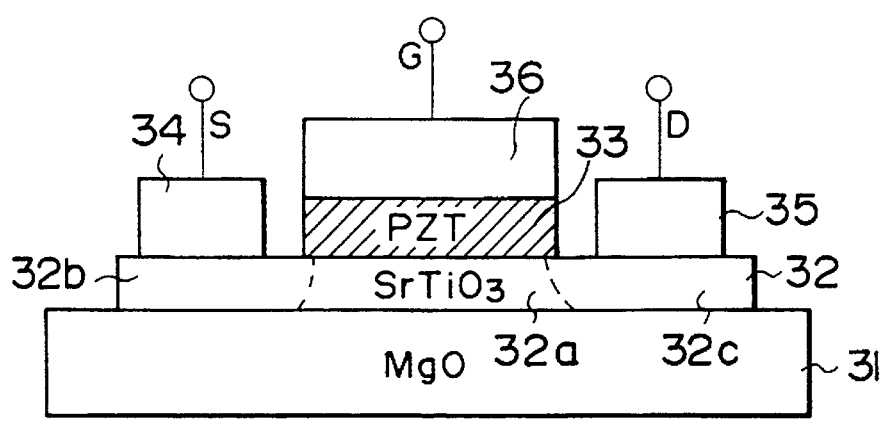
FIG. 4 is a diagram showing the construction of a ferroelectric memory device according to a third embodiment of the present invention.

FIG. 4 shows the structure of a ferroelectric memory device according to a third embodiment of the present invention.

Referring to FIG. 4, the memory device is constructed upon a substrate 31 of single crystal MgO and includes a channel layer 32 of $SrTiO_3$ grown epitaxially on the substrate 31.

The channel layer 32 includes a source region 32b and a drain region 32c doped to the $n^+$-type, with a channel region 32a defined between the source region 32b and the drain region 32c. On the channel region 32a, there is provided a ferroelectric gate insulation film 33 of PZT or $PbTiO_3$ on which a gate electrode 36 is provided. Further, a source electrode 34 and a drain electrode 35 are provided on the upper major surface of the channel layer 32 respectively in correspondence to the source region 32b and the drain region 32c. Similarly as before, the source and drain electrodes 34 and 35 form an ohmic contact while the gate electrode 36 forms a Schottky contact. In the circuit in which the source is grounded, the gate voltage is applied across the source electrode 34 and the gate electrode 36.

In the structure of FIG. 4, it is possible to conduct the deposition of the oxide channel layer 32 and the ferroelectric gate insulation film 33 at high temperature by using MgO for the substrate 31. It should be noted that the deposition of the channel layer 32 or gate insulation film 33 is conducted by sputtering or CVD process. It should be noted that one can also use YSZ (yttrium stabilized zirconia) in place of MgO for the substrate 31.

As the operation of the device is substantially identical to the embodiments described previously, further description thereof will be omitted.

Figure 5:
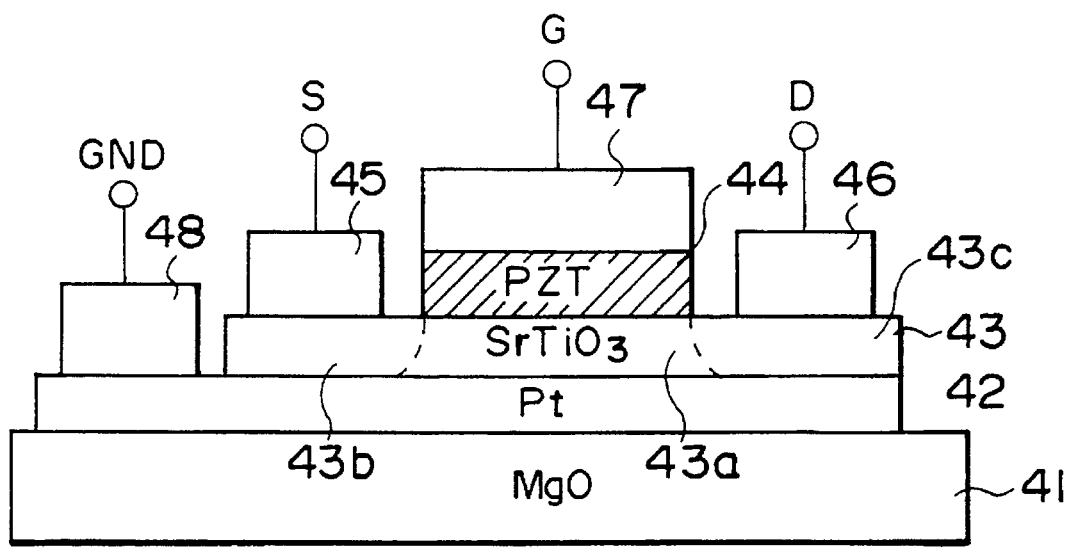
FIG. 5 is a diagram showing the construction of a ferroelectric memory device according to a fourth embodiment of the present invention.

FIG. 5 shows the structure of the ferroelectric memory device according to a fourth embodiment of the present invention.

Referring to FIG. 5, the device is constructed upon a substrate 41 of MgO, on which a layer 42 of Pt is deposited. On the Pt layer 42, there is provided a channel layer 43 of $SrTiO_3$ that carries thereon a ferroelectric gate insulation film 44 of PZT or $PbTiO_3$ in correspondence to a channel region 43a defined in the channel layer 43. Further, a source electrode 45 and a drain electrode 46 are provided on the channel layer 43 at both lateral sides of the ferroelectric layer 44, respectively in correspondence to source and drain regions 43b and 43c of the $n^+$-type that are formed in the channel layer 43 at both lateral sides of the channel region 43a. In addition, a gate electrode 47 and a ground electrode 48 are provided respectively upon the ferroelectric gate insulation film 44 and the exposed part of the Pt layer 42.

In the structure of FIG. 5, it is possible to apply the electric field that induces a polarization in the ferroelectric film 44 efficiently, as the electrodes 42 and 47 are disposed at upper and lower sides of the structure formed of a stack of the $SrTiO_3$ channel layer 43 and the ferroelectric gate insulation film 44. In the device of FIG. 5, it is also possible to use YSZ for the MgO substrate 41.

As other features of the present embodiment are apparent from the previous embodiments, further description thereof will be omitted.

Figure 6:
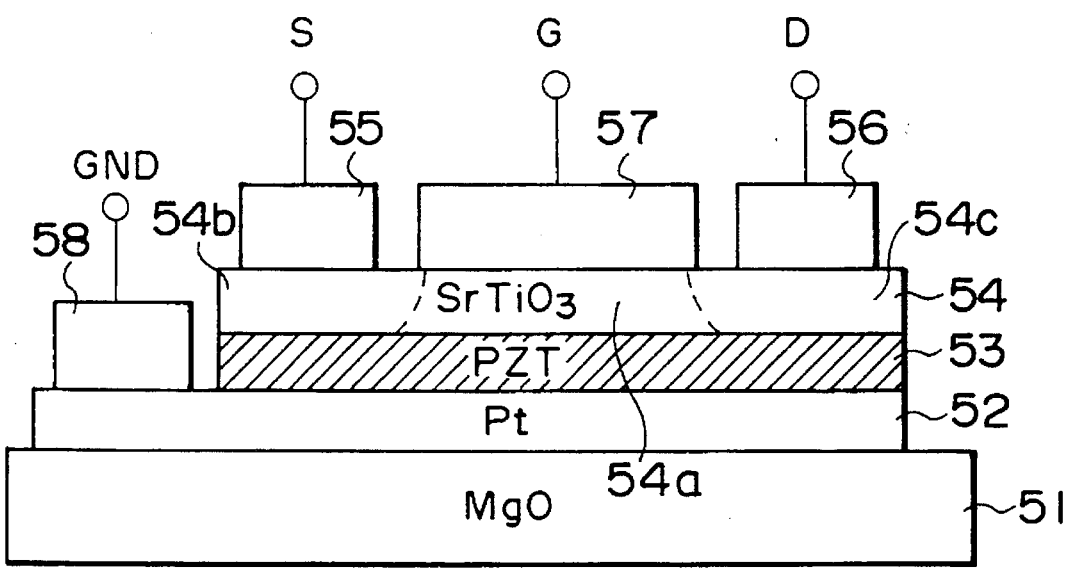
FIG. 6 is a diagram showing the construction of a ferroelectric memory device according to a fifth embodiment of the present invention.

FIG. 6 shows the structure of a ferroelectric memory device according to a fifth embodiment of the present invention.

Referring to FIG. 6, the device is constructed upon an MgO substrate 51 similar to the MgO substrate 41, in which a Pt layer 52 is provided on the MgO substrate 51 similarly to the structure of FIG. 5.

On the Pt layer 52, there is provided a ferroelectric layer 52 of PZT or $PbTiO_3$ on which a channel layer 54 of $SrTiO_3$ is deposited. Similarly to the previous embodiments, the channel layer 54 includes a channel region 54a defined laterally by source and drain regions 54b and 54c both doped to the $n^+$-type, and a gate electrode 57 is provided on the channel layer 54 in correspondence to the channel region 54a. Further, source and drain electrodes 55 and 56 are provided on the channel layer 54 respectively in correspondence to the source and drain regions 54b and 54c. Furthermore, there is provided a ground electrode 58 on the exposed part of the Pt layer 52.

As other features of the present embodiment are apparent from the previous embodiments, further description thereof will be omitted.

In the structure of FIG. 6, too, it is possible to apply the electric field that induces a polarization in the ferroelectric film 53 efficiently, as the electrodes 52 and 57 are disposed at upper and lower sides of the structure formed of a stack of the $SrTiO_3$ channel layer 54 and the ferroelectric film 53. In the device of FIG. 6, it is also possible to use YSZ for the MgO substrate 51.

Figure 7:
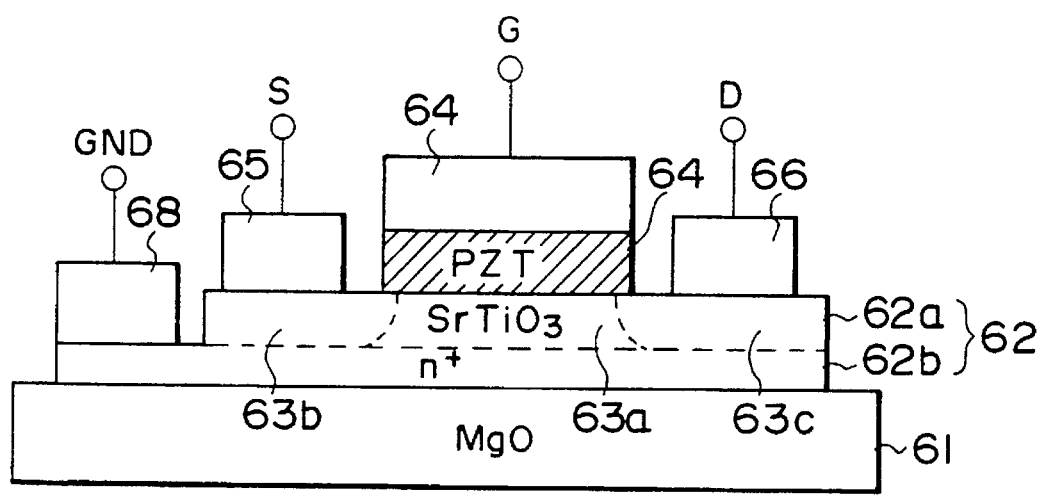
FIG. 7 is a diagram showing the construction of a ferroelectric memory device according to a sixth embodiment of the present invention.

FIG. 7 shows the structure of a ferroelectric memory device according to a sixth embodiment of the present invention.

Referring to FIG. 7, the device is constructed upon a substrate 51 of MgO on which a channel layer 62 of $SrTiO_3$ is provided. The channel layer 62 actually includes a lower layer 62b doped to the $n^+$-type and an upper layer 62a of the $n^+$-type, wherein the lower layer 62b shows a conductivity similar to that of metal and acts like the Pt layer 42 of the embodiment of FIG. 5.

Thus, in the structure of FIG. 7, the upper layer 62a of the layer 62 acts as the actual channel layer, and a ferroelectric gate insulation film 64 of PZT or $PbTiO_3$ is provided on the layer 62a in correspondence to a channel region 63a defined in the layer 62a. Further, a gate electrode 67 is provided on the ferroelectric gate insulation film 64. In the layer 62a, on the other hand, a source region 63b and a drain region 63c both of the $n^+$-type are formed at both lateral sides of the channel region 63a.

Further, a source electrode 65 and a drain electrode 66 are provided on the layer 62a respectively in contact with the source and drain regions 63b and 63c. In addition, a ground electrode 68 is provided on the conductive layer 62b. Thereby, the electrodes 65 and 66 establish an ohmic contact with the layer 62a, while the electrodes 67 and 68 form a Schottky contact with the ferroelectric gate insulation film 64 and the conductive layer 62b respectively.

Figure 8:
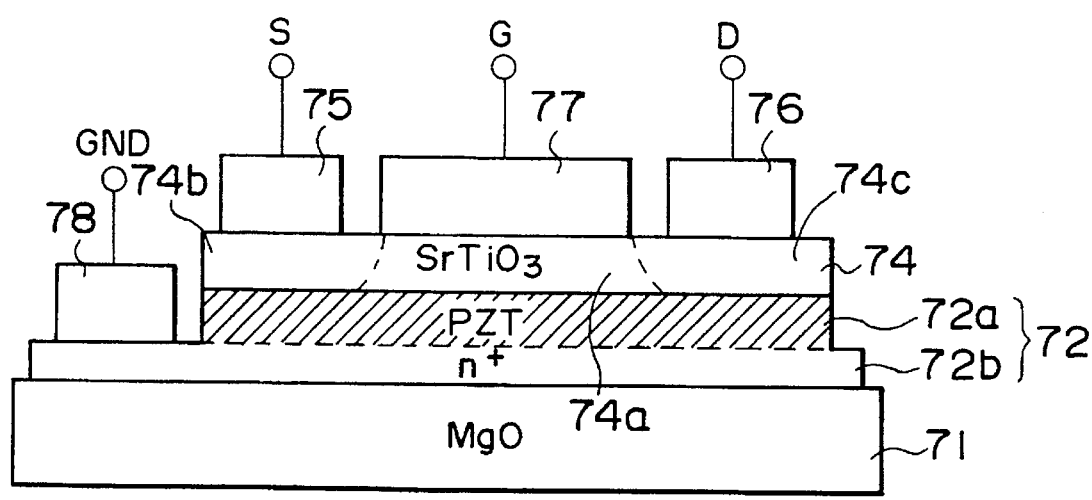
FIG. 8 is a diagram showing the construction of a ferroelectric memory device according to a seventh embodiment of the present invention.

In the structure of FIG. 8, it should be noted that the layer 62 grows epitaxially on the MgO substrate. Thus, the channel layer 62a provides a preferable feature of high speed electron transport as compared with the corresponding structure of FIG. 5.

As other features of the present embodiment are apparent from the previous embodiments, further description thereof will be omitted.

FIG. 8 shows the structure of a ferroelectric memory device according to a seventh embodiment of the present invention.

Referring to FIG. 8, the device is constructed upon a substrate 71 of MgO on which a ferroelectric film 72 of PZT or $PbTiO_3$ is provided. The ferroelectric layer 72 actually includes a lower layer 72b doped to the $n^+$-type and an upper layer 72a of the $n^+$-type, wherein the lower layer 72b shows a conductivity similar to that of metal and acts like the Pt layer 52 of the embodiment of FIG. 6.

Thus, in the structure of FIG. 8, the upper layer 72a of the layer 72 acts as the actual ferroelectric layer, and a channel layer 74 of $SrTiO_3$ is provided on the layer 72a in correspondence to the layer 54 of FIG. 6. Further, a gate electrode 77 is provided on the channel layer 74 in correspondence to a channel region 74a defined in the channel layer 74, wherein the channel layer 74 further includes a source region 74b and a drain region 74c both of the $n^+$-type at both lateral sides of the channel region 74a.

Further, a source electrode 75 and a drain electrode 76 are provided on the layer 74 respectively in contact with the source and drain regions 74b and 74c. In addition, a ground electrode 68 is provided on the conductive layer 62b. Thereby, the electrodes 75 and 76 establish an ohmic contact with the layer 74, while the electrodes 77 and 78 form a Schottky contact with the channel region 74a of the channel layer 74 and the conductive layer 72b respectively.

In the structure of FIG. 8, it should be noted that the layer 72 grows epitaxially on the MgO substrate 71. Thus, the channel layer 74a provides a preferable feature of high speed electron transport as compared with the corresponding structure of FIG. 6.

As other features of the present embodiment are apparent from the previous embodiments, further description thereof will be omitted.

What is claimed is:

1. A ferroelectric memory device for storing information in the form of ferroelectric polarization, comprising:

a channel layer of a dielectric material containing oxygen, said channel layer causing carriers to flow therethrough;

a source electrode provided on said channel layer for injecting carriers into said channel layer;

a drain electrode provided on said channel layer with a separation from said source electrode for collecting carriers from said channel layer;

a source region defined in said channel layer in correspondence to said source electrode;

a drain region defined in said channel layer in correspondence to said drain electrode;

a channel region defined in said channel layer between said source region and said drain region as a passage of carriers;

said source region being depleted of oxygen as compared with said channel region;

said drain region being depleted of oxygen as compared with said channel region;

a ferroelectric memory layer provided adjacent to said channel layer so as to cover at least said channel region; and write control means provided on said ferroelectric memory layer for applying an electric field to said ferroelectric memory layer.

2. A ferroelectric memory device as claimed in claim 1, wherein said channel layer comprises an oxide having either of perovskite structure and spinel structure.

3. A ferroelectric memory device as claimed in claim 1, wherein said channel layer comprises $SrTiO_3$.

4. A ferroelectric memory device for storing information in the form of ferroelectric polarization, comprising:

a channel layer of a dielectric material containing oxygen, said channel layer causing carriers to flow therethrough;

a source electrode provided on said channel layer for injecting carriers into said channel layer;

a drain electrode provided on said channel layer with a separation from said source electrode for collecting carriers from said channel layer;

a channel region defined in said channel layer between said source electrode and said drain electrode as a passage of carriers;

said drain region being depleted of oxygen as compared with said channel region;

a ferroelectric memory layer provided adjacent to said channel layer so as to cover at least said channel region; and write control means provided on said ferroelectric memory layer for applying an electric field to said ferroelectric memory layer, wherein said write control means includes a first control electrode contacting with said ferroelectric memory layer and a second control electrode contacting with said channel layer.

5. A ferroelectric memory device as claimed in claim 4, wherein said first and second control electrodes establish a Schottky contact with said ferroelectric memory layer and said channel layer respectively.

6. A ferroelectric memory device as claimed in claim 4, wherein said ferroelectric memory layer includes a conductive region of increased carrier density, said conductive region serving for said first control electrode.

7. A ferroelectric memory device as claimed in claim 4, wherein said channel layer includes a conductive region of increased carrier density, said conductive region serving for said second control electrode.

8. A ferroelectric memory device as claimed in claim 1, wherein said ferroelectric memory device includes a substrate of a dielectric material as said channel layer, said substrate carrying said source electrode, said drain electrode and said ferroelectric memory layer on an upper major surface thereof, said ferroelectric memory layer acting thereby a gate insulation film of a MOS transistor, said write control means including a first control electrode provided on said ferroelectric memory layer as a gate electrode and a second control electrode provided on a lower major surface of said substrate.

9. A ferroelectric memory device as claimed in claim 1, wherein said ferroelectric memory device includes a substrate of a ferroelectric material as said ferroelectric layer, said substrate carrying said channel layer on an upper major surface thereof, said channel layer carrying thereon said source and drain electrodes on an upper major surface thereof, and wherein said write control means includes a first control electrode provided on an upper major surface of said channel layer as a gate electrode and a second control electrode provided on a lower major surface of said substrate.

10. A ferroelectric memory device as claimed in claim 1, wherein said ferroelectric memory device includes an insulating substrate having upper and lower major surfaces, said substrate carrying said channel layer on said upper major surface, said ferroelectric memory layer being provided on an upper major surface of said channel layer in correspondence to said channel region, said channel layer further carrying said source and drain regions on said upper major surface thereof, and wherein said write control means comprises a first write control electrode provided on said ferroelectric memory layer and a second write control electrode provided on said lower major surface of said substrate.

11. A ferroelectric memory device as claimed in claim 1, wherein said ferroelectric memory device includes an insulating substrate carrying thereon a conductor layer, said conductor layer carrying thereon said channel layer on an upper major surface thereof, said channel layer in turn carrying said ferroelectric memory layer thereon, said write control means comprising a first control electrode provided on said ferroelectric memory layer and a second control electrode provided on said upper major surface of said conductor layer.

12. A ferroelectric memory device as claimed in claim 11, wherein said conductor layer comprises a metal.

13. A ferroelectric memory device as claimed in claim 11, wherein said conductor layer comprises a dielectric layer having a composition identical to said channel layer thereon, said dielectric layer being doped to have a conductivity of a metal.

14. A ferroelectric memory device as claimed in claim 1, wherein said ferroelectric memory device includes an insulating substrate carrying thereon a conductor layer, said conductor layer having an upper major surface on which said ferroelectric memory layer is provided, said ferroelectric memory layer carrying thereon said channel layer, said channel layer in turn carrying thereon said source and drain electrodes, wherein said write control means comprises a first control electrode provided on said channel layer in correspondence to said channel region and a second control electrode provided on said upper major surface of said conductor layer.

15. A ferroelectric memory device as claimed in claim 14, wherein said conductor layer comprises a metal.

16. A ferroelectric memory device as claimed in claim 14, wherein said conductor layer comprises a ferroelectric layer having a composition identical to the ferroelectric channel layer, said ferroelectric layer being doped to have a conductivity of a metal.

* * * * *